United States Patent
Olbrich et al.

(10) Patent No.: US 8,484,533 B2
(45) Date of Patent: *Jul. 9, 2013

(54) MLC SELF-RAID FLASH DATA PROTECTION SCHEME

(75) Inventors: Aaron K. Olbrich, Morgan Hill, CA (US); Doug Prins, Laguna Hills, CA (US)

(73) Assignee: Sandisk Enterprise IP LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/535,237

(22) Filed: Jun. 27, 2012

(65) Prior Publication Data

US 2012/0266052 A1  Oct. 18, 2012

Related U.S. Application Data

(62) Division of application No. 12/726,200, filed on Mar. 17, 2010, now Pat. No. 8,365,041.

(51) Int. Cl.
*G11C 29/00* (2006.01)

(52) U.S. Cl.
USPC .......................... 714/763; 714/801; 711/114

(58) Field of Classification Search
None
See application file for complete search history.

(56) References Cited

U.S. PATENT DOCUMENTS

| | | | |
|---|---|---|---|
| 4,916,652 A | 4/1990 | Schwarz et al. | |
| 5,530,705 A | 6/1996 | Malone, Sr. | |
| 5,537,555 A | 7/1996 | Landry et al. | |
| 5,551,003 A | 8/1996 | Mattson et al. | |
| 5,657,332 A | 8/1997 | Auclair et al. | |
| 5,666,114 A | 9/1997 | Brodie et al. | |
| 5,943,692 A | 8/1999 | Marberg et al. | |
| 5,982,664 A | 11/1999 | Watanabe | |
| 6,000,006 A | 12/1999 | Bruce et al. | |
| 6,016,560 A | 1/2000 | Wada et al. | |
| 6,295,592 B1 | 9/2001 | Jeddeloh et al. | |
| 6,311,263 B1 | 10/2001 | Barlow et al. | |
| 6,442,076 B1 | 8/2002 | Roohparvar | |

(Continued)

FOREIGN PATENT DOCUMENTS

| | | |
|---|---|---|
| EP | 1465203 A1 | 10/2004 |
| JP | 2002-532806 | 10/2002 |

(Continued)

OTHER PUBLICATIONS

SanDisk Enterprise, Office Action, Chinese Patent Application 200880127623.8, Apr. 18, 2012, 12 pgs.

(Continued)

*Primary Examiner* — Yolanda L Wilson
(74) *Attorney, Agent, or Firm* — Morgan, Lewis & Bockius LLP

(57) ABSTRACT

A two-dimensional self-RAID method of protecting page-based storage data in a MLC multiple-level-cell flash memory device. The protection scheme includes reserving one parity sector across each data page, reserving one parity page as the column parity, selecting a specific number of pages to form a parity group, writing into the parity page a group parity value for data stored in the pages of the parity group. The parity sector represents applying a RAID technique in a first dimension. The group parity represents applying a RAID technique in a second dimension. Data protection is achieved because a corrupted data sector can likely be recovered by the two dimensional RAID data.

26 Claims, 14 Drawing Sheets

U.S. PATENT DOCUMENTS

| | | |
|---|---|---|
| 6,449,625 B1 | 9/2002 | Wang |
| 6,484,224 B1 | 11/2002 | Robins et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,032,123 B2 | 4/2006 | Kane et al. |
| 7,043,505 B1 | 5/2006 | Teague et al. |
| 7,100,002 B2 | 8/2006 | Shrader et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,516,292 B2 | 4/2009 | Kimura et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,971,112 B2 | 6/2011 | Murata |
| 7,978,516 B2 | 7/2011 | Olbrich et al. |
| 7,996,642 B1 | 8/2011 | Smith |
| 8,032,724 B1 | 10/2011 | Smith |
| 2002/0024846 A1 | 2/2002 | Kawahara et al. |
| 2002/0083299 A1 | 6/2002 | Van Huben et al. |
| 2002/0152305 A1 | 10/2002 | Jackson et al. |
| 2002/0162075 A1 | 10/2002 | Talagala et al. |
| 2003/0041299 A1 | 2/2003 | Kanazawa et al. |
| 2003/0043829 A1 | 3/2003 | Rashid et al. |
| 2003/0088805 A1 | 5/2003 | Majni et al. |
| 2003/0188045 A1 | 10/2003 | Jacobson |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader et al. |
| 2005/0114587 A1 | 5/2005 | Chou et al. |
| 2005/0172065 A1 | 8/2005 | Keays |
| 2005/0193161 A1 | 9/2005 | Lee et al. |
| 2005/0201148 A1 | 9/2005 | Chen et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0053246 A1 | 3/2006 | Lee |
| 2006/0085671 A1 | 4/2006 | Majni et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0113019 A1 | 5/2007 | Beukema |
| 2007/0133312 A1 | 6/2007 | Roohparvar |
| 2007/0147113 A1 | 6/2007 | Mokhlesi et al. |
| 2007/0150790 A1 * | 6/2007 | Gross et al. .................. 714/763 |
| 2007/0174579 A1 | 7/2007 | Shin |
| 2007/0180188 A1 | 8/2007 | Fujibayashi et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0052446 A1 | 2/2008 | Lasser et al. |
| 2008/0077841 A1 | 3/2008 | Gonzalez et al. |
| 2008/0144371 A1 | 6/2008 | Yeh et al. |
| 2008/0147964 A1 | 6/2008 | Chow et al. |
| 2008/0148124 A1 | 6/2008 | Zhang et al. |
| 2008/0163030 A1 | 7/2008 | Lee |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2009/0037652 A1 | 2/2009 | Yu et al. |
| 2009/0168525 A1 | 7/2009 | Olbrich et al. |
| 2009/0172258 A1 | 7/2009 | Olbrich et al. |
| 2009/0172259 A1 | 7/2009 | Prins |
| 2009/0172260 A1 | 7/2009 | Olbrich |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0296466 A1 | 12/2009 | Kim et al. |
| 2009/0296486 A1 | 12/2009 | Kim et al. |
| 2009/0319864 A1 | 12/2009 | Shrader |
| 2010/0103737 A1 | 4/2010 | Park |
| 2010/0199125 A1 | 8/2010 | Reche |
| 2010/0202196 A1 | 8/2010 | Lee et al. |
| 2010/0262889 A1 | 10/2010 | Bains |
| 2010/0281207 A1 | 11/2010 | Miller et al. |
| 2011/0083060 A1 | 4/2011 | Sakurada et al. |
| 2011/0131444 A1 | 6/2011 | Buch et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0195126 A1 | 8/2012 | Roohparvar |

FOREIGN PATENT DOCUMENTS

| | | | |
|---|---|---|---|
| WO | WO 2008/121553 A1 | 10/2008 | |
| WO | WO 2008/121577 A1 | 10/2008 | |
| WO | WO 2009/058140 A1 | 5/2009 | |
| WO | WO 2009/134576 A1 | 11/2009 | |

OTHER PUBLICATIONS

Pliant Technology, Inc., Supplementary European Search Report for EP Application 08866997.3, dated Feb. 23, 2012, 6 pgs.

Zeldman, 1999, Verilog Designer's Library (04US), Bob Zeidman, Zeidman Consulting, Cupertino Ca., 9 pgs.

Kim, A Space-Efficient Flash Translation Layer for Compact Flash Systems, IEEE Transactions on Consumer Electronics, vol. 48, No. 2, May 2002, 10 pgs.

McLean, Information Technology—AT Attachment with Packet Interface Extension, Aug. 19, 1998, 339 pgs., Maxtor Corporation, Longmont, CO.

Murphy, Introduction to Watchdog Timers, Oct. 10, 2001, 6pgs., EE Times.

Park, A High Performance Controller for NAND Flash-Based Solid State Disk (NSSD), Feb. 16, 2006, 4pgs., Samsung Electronics Co.

Pliant Technology, ISR and Written Opinion, PCT/US08/88133, Mar. 19, 2009, 7 pgs.

Pliant Technology, ISR and Written Opinion, PCT/US08/88136, Mar. 19, 2009, 7 pgs.

Pliant Technology, ISR and Written Opinion, PCT/US08/88146, Feb. 26, 2009, 10 pgs.
Pliant Technology, ISR and Written Opinion, PCT/US08/88154, Feb. 27, 2009, 9 pgs.
Pliant Technology, ISR and Written Opinion, PCT/US08/88164, Feb. 13, 2009, 6 pgs.
Pliant Technology, ISR and Written Opinion, PCT/US08/88206, Feb. 18, 2009, 8 pgs.
Pliant Technology, ISR and Written Opinion, PCT/US08/88217, Feb. 19, 2009, 7 pgs.
Pliant Technology, ISR and Written Opinion, PCT/US08/88229, Feb. 13, 2009, 8 pgs.
Pliant Technology, ISR and Written Opinion, PCT/US08/88232, Feb. 19, 2009, 8 pgs.
Pliant Technology, ISR and Written Opinion, PCT/US08/88236, Feb. 19, 2009, 7 pgs.
International Search Report and Written Opinion for PCT/US2011/028637, dated Oct. 27, 2011, 13 pages.
SanDisk Enterprise, ISR/WO, PCT/US2012/042764, Aug. 31, 2012, 12 pgs.
SanDisk Enterprise, Office Action, Japanese Patent Application No. 2010-540863, Jul. 24, 2012, 3 pgs.
Kang, A Multi-Channel Architecture for High-Performance NAND Flash-Based Storage System, J. Syst. Archit., 53, 9, Sep. 2007, 15 pgs.
Watchdog Timer and Power Savin Modes, Microchip Technology Inc., 2005 14 pgs.
SanDisk Enterprise, ISR/WO, PCT/US2012/042775, Sep. 26, 2012, 8 pgs.
Sandisk Enterprise, ISR/WO, PCT/US2012/059459, Feb. 14, 2013, 9 pgs.
SanDisk Enterprise, Office Action, CN 200880127623.8, Dec. 31, 2012, 9 pgs.
Sandisk Enterprise IP LLC, ISR/WO, PCT/US2012/042771, Mar. 4, 2013, 14 pgs.

* cited by examiner

Prior Art

Note: 709 is the control gate and 704a is the isolated floating gate.

Column parity

| Page no | sector X parity | | sec 00 parity |
|---|---|---|---|
| Page 63 | Sec X | | Sec 00 |
| Page 62 | Sec X | ................. | Sec 00 |
| Page 61 | Sec X | ................. | Sec 00 |
| Page 60 | Sec X | ................. | Sec 00 |
| Page 59 | Sec X | ................. | Sec 00 |
| | | ................. | |
| Page 13 | Sec X | ................. | Sec 00 |
| Page 12 | Sec X | ................. | Sec 00 |
| Page 11 | Sec X | ................. | Sec 00 |
| Page 10 | Sec X | ................. | Sec 00 |
| Page 9 | Sec X | ................. | Sec 00 |
| Page 8 | Sec X | ................. | Sec 00 |
| Page 7 | Sec X | ................. | Sec 00 |
| Page 6 | Sec X | ................. | Sec 00 |
| Page 5 | Sec X | ................. | Sec 00 |
| Page 4 | Sec X | ................. | Sec 00 |
| Page 3 | Sec X | ................. | Sec 00 |
| Page 2 | Sec X | ................. | Sec 00 |
| Page 1 | Sec X | ................. | Sec 00 |
| Page 0 | Sec X | ................. | Sec 00 |

Sector X parity summarizes all data in Sec X of all pages

FIG. 6

Flash memory first dimensional RAID - sector parity
| Page X | 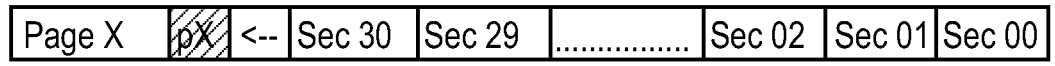 |
|---|---|
| Page 0 | 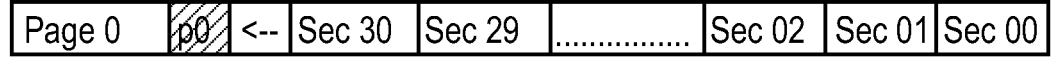 |
|---|---|
pX is parity sector (shaded bock) over 31 sectors in Page X  
Sector parity id in shaded blocks as 
FIG. 7

Group parity with 8 pages in each group

| Page no | sector X parity | | sec 00 parity |
|---|---|---|---|
| Page 63 | Sec X | | Sec 00 |
| Page 62 | Sec X | ..................... | Sec 00 |
| Page 61 | Sec X | ..................... | Sec 00 |
| Page 60 | Sec X | ..................... | Sec 00 |
| Page 59 | Sec X | ..................... | Sec 00 |
| | | ..................... | |
| Page 13 | Sec X | ..................... | Sec 00 |
| Page 12 | Sec X | ..................... | Sec 00 |
| Page 11 | Sec X | ..................... | Sec 00 |
| Page 10 | Sec X | ..................... | Sec 00 |
| Page 9 | Sec X | ..................... | Sec 00 |
| Page 8 | Sec X | ..................... | Sec 00 |
| Page 7 | Sec X | ..................... | Sec 00 |
| Page 6 | Sec X | ..................... | Sec 00 |
| Page 5 | Sec X | ..................... | Sec 00 |
| Page 4 | Sec X | ..................... | Sec 00 |
| Page 3 | Sec X | ..................... | Sec 00 |
| Page 2 | Sec X | ..................... | Sec 00 |
| Page 1 | Sec X | ..................... | Sec 00 |
| Page 0 | Sec X | ..................... | Sec 00 |

Group parity pages are in shaded blocks as 

FIG. 8

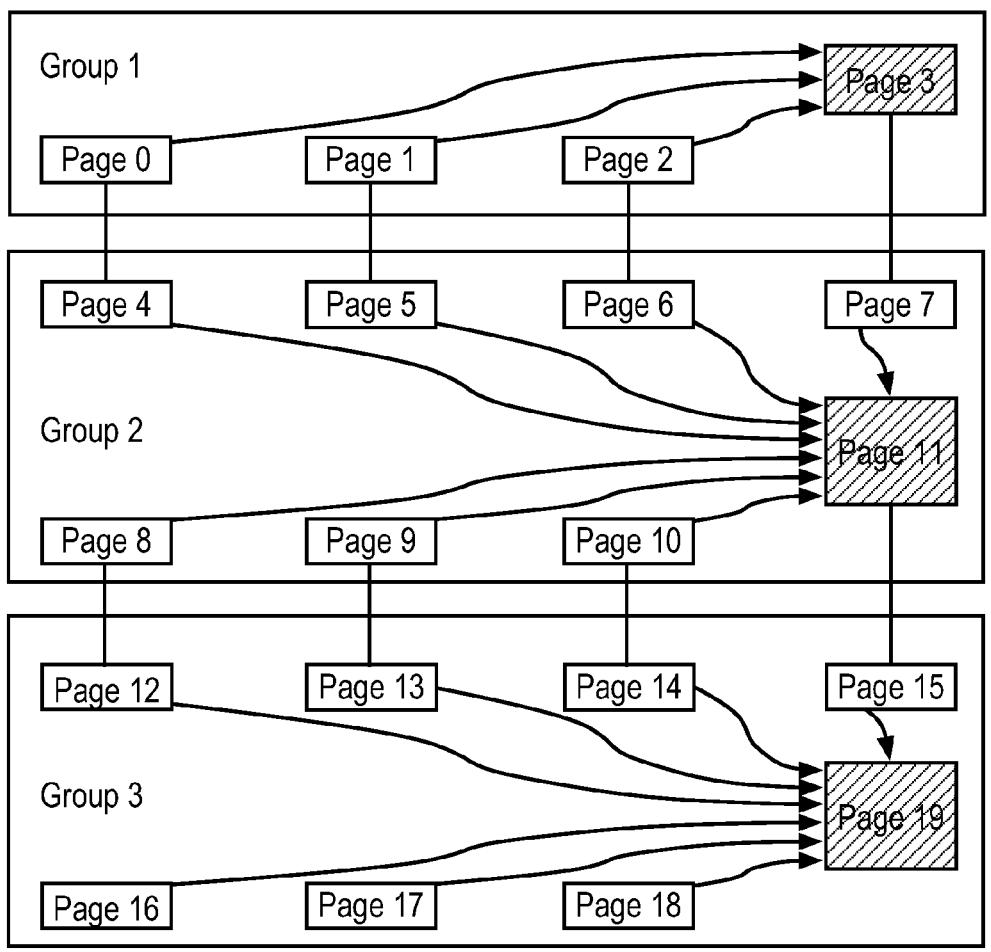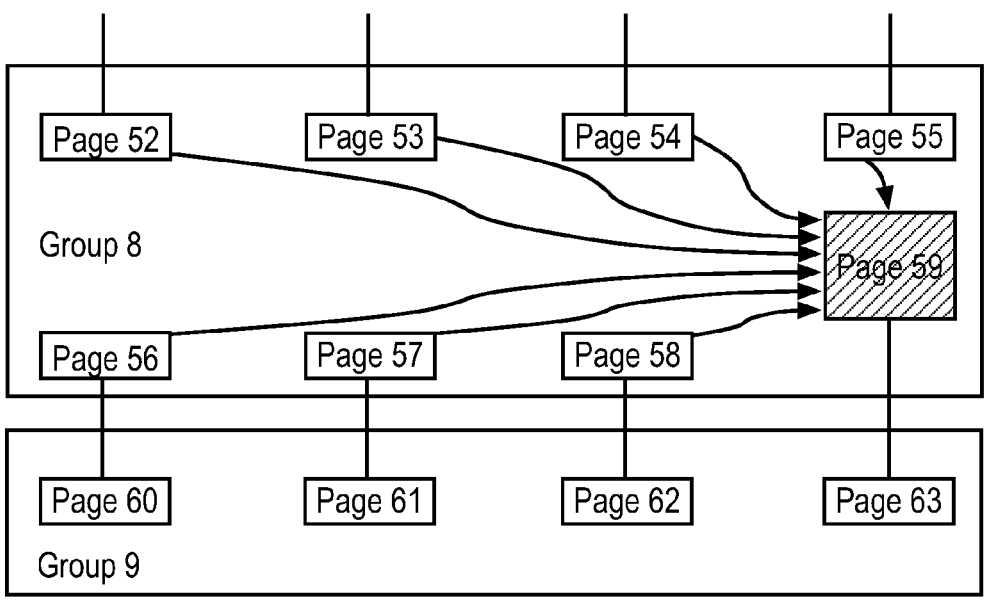
FIG. 10

MLC SELF-RAID FLASH DATA PROTECTION SCHEME

CROSS-REFERENCE TO RELATED APPLICATIONS

This application is a divisional of U.S. application Ser. No. 12/726,200, filed Mar. 17, 2010, now U.S. Pat. No. 8,365,041, which is incorporated by reference herein its entirety.

This application is related to the following co-pending patent applications: (1) U.S. patent application Ser. No. 13/535,243, filed Jun. 27, 2012; and (2) U.S. patent application Ser. No. 13/535,250, filed Jun. 27, 2012, which are incorporated by reference herein their entirety.

This application also relates to subject matter in the following co-pending patent applications: U.S. patent application Ser. No. 12/082,202, filed on Apr. 8, 2008, entitled "System and Method for Performing Host Initiated Mass Storage Commands Using a Hierarchy of Data Structures"; U.S. patent application Ser. No. 12/082,205, filed on Apr. 8, 2008, entitled "Flash Memory Controller Having Reduced Pinout"; U.S. patent application Ser. No. 12/082,221, filed on Apr. 8, 2008, entitled "Multiprocessor Storage Controller"; U.S. patent application Ser. No. 12/082,207, filed on Apr. 8, 2008, entitled "Storage Controller for Flash Memory Including a Crossbar Switch Connecting a Plurality of Processors with a Plurality of Internal Memories"; U.S. patent application Ser. No. 12/082,220, filed on Apr. 8, 2008, entitled "Flash Memory Controller and System Including Data Pipelines Incorporating Multiple Buffers"; U.S. patent application Ser. No. 12/082,206, filed on Apr. 8, 2008, entitled "Mass Storage Controller Volatile Memory Containing Metadata Related to Flash Memory Storage"; U.S. patent application Ser. No. 12/082,204, filed on Apr. 8, 2008, entitled "Patrol Function Used in Flash Storage Controller to Detect Data Errors"; U.S. patent application Ser. No. 12/082,223, filed on Apr. 8, 2008, entitled "Flash Storage Controller Execute Loop"; U.S. patent application Ser. No. 12/082,222, filed on Apr. 8, 2008, entitled "Metadata Rebuild in a Flash Memory Controller Following a Loss of Power", and U.S. patent application Ser. No. 12/082,203, filed on Apr. 8, 2008, entitled "Flash Memory Controller Garbage Collection Operations Performed Independently in Multiple Flash Memory Groups," which are incorporated by reference herein their entirety.

FIELD OF THE INVENTION

The invention described herein relates to data storage management in semiconductor flash memories, and in particular to a data storage protection method that prevents data corruption in multiple level cell (MLC) memory devices in the event of a power interruption.

BACKGROUND OF THE INVENTION

Current enterprise-level mass storage relies on hard drives that are typically characterized by a 3.5" form factor, a 15,000 rpm spindle motor and a storage capacity between 73 GB and 450 GB. The mechanical design follows the traditional hard drive with a single actuator and 8 read/write heads moving across 8 surfaces. The constraints of the head/media technology limit the read/write capabilities to using only one active head at a time. All data requests that are sent to the drive are handled in a serial manner, with long delays between operations, as the actuator moves the read/write head to the required position and the media rotates to place the data under the read/write head.

A solid state memory device is attractive in an enterprise mass-storage environment. For that environment, the flash memory is a good candidate among various solid state memory devices, since it does not have the mechanical delays associated with hard drives, thereby allowing higher performance and commensurately lower cost, and better usage of power and space.

The flash memory is a form of non-volatile memory, i.e., EEPROM (electronically erasable programmable read-only memory). A memory cell in a flash memory array generally includes a transistor having a control gate and drain and source diffusion regions formed in a substrate. The transistor has a floating gate under the control gate, thus forming an electron storage device. A channel region lies under the floating gate, isolated by an insulation layer (e.g., a tunnel oxide layer) between the channel and the floating gate. The energy barrier imposed by the insulating layer against charge carriers movement into or out of the floating gate can be overcome by applying a sufficiently high electric field across the insulating layer. The charge stored in the floating gate determines the threshold voltage (Vt) of the cell, which represents the stored data of the cell. Charge stored in the floating gate causes the cell to have a higher Vt. To change the Vt of a cell to a higher or lower value, the charge stored in the floating gate is increased or decreased by applying appropriate voltages at the control gate, the drain and source diffusion regions, and the channel region. The appropriate voltages cause charge to move between one or more of these regions and through the insulation layer to the floating gate.

A single-level cell (SLC) flash memory device has a single threshold voltage Vt and can store one bit of data per cell. A memory cell in a multiple-level cell (MLC) flash memory device has multiple threshold voltages, and depending on the amount of charge stored in the floating gate, can represent more than one bit of data. Because a MLC flash memory device enables the storage of multiple data bits per cell, high density mass storage applications (such as 512 Mb and beyond) are readily achievable. In a typical four-level two-bit MLC flash memory device, the cell threshold voltage Vt can be set at any of four levels to represent data "00", "01", "10", and "11". To program the memory cell to a given level, the cell may be programmed multiple times. Before each write, a flash memory array is erased to reset every cell in the array to a default state. As a result, multiple data bits that share the same cell and their electronic states, (hence their threshold voltage Vt's), are interdependent to a point that an unexpected power interruption can generate unpredictable consequences. Variations in the electronic states of the memory cells also generate variations within ranges of threshold voltages in a real system. Table 1 below shows the electronic states and the threshold voltage ranges in a two-bit MLC.

TABLE 1

Threshold voltages and bit values in a two-bit MLC memory cell

| Vt | Bit 1 | Bit 2 |
| --- | --- | --- |
| −4.25 V to −1.75 V | 1 | 1 |
| −1.75 V to 0.75 V | 1 | 0 |
| 0.75 V to 3.25 V | 0 | 1 |
| 3.25 V to 5.75 V | 0 | 0 |

In spite of the advantages of MLC over SLC, MLC flash memory devices have not traditionally been used because of certain technical constraints, among which data corruption presents one of the most severe challenges.

All flash memories have a finite number of erase-write cycles. MLC flash memory devices are more vulnerable to data corruption than SLC flash memory devices. The specified erase cycle limit for each flash memory page is typically in the order of 100,000 cycles for SLC flash memory devices and typically in the order of 10,000 cycles for MLC devices. The lower cycle limit in the MLC flash memory devices poses particular problems for data centers that operate with unpredictable data streams. The unpredictable data streams may cause "hot spots", resulting in certain highly-used areas of memory being subject to a large number of erase cycles.

In addition, various factors in normal operation can also affect flash memory integrity, including read disturbs or program disturbs. These disturbs lead to unpredictable loss of data bits in a memory cell, as a result of the reading or writing of memory cells adjacent to the disturbed cell. Sudden data losses in MLC flash memory devices due to unexpected power interruptions require frequent data recoveries. Because some data levels require more than one write operations to achieve and because more than one bit of data share the same memory cell, a power change or a program error during a write data operation leaves the data in a wrong state. When the power returns, the memory cell can be in an erratic state. Therefore a power interruption is a major risk to the integrity of data stored in MLC flash memory devices.

Flash media typically are written in units called "pages"; each page typically includes between 2000 bytes and 8000 bytes. Flash media typically are erased in units called "blocks". Each block typically includes between 16 and 64 pages. Pages in MLC flash memory devices are coupled into paired pages. The number of paired pages maybe two for the 2-bit MLC and may go up to 3 to 4 or higher for higher bit MLCs. The paired pages may reside in shared MLC flash memory cells. If the power failure occurs while the MLC is in the middle of an operation that changes the contents of the flash media (e.g., in the middle of writing a page of data or in the middle of erasing a block of data), the electrical states of the interrupted page or block are unpredictable after the device is powered up again. The electrical states can even be random, because some of the affected bits may already be in the states assigned to them by the operation, at the time power is interrupted. However, other bits may be lagging behind and have not yet reached their target values yet. Furthermore, some bits might be caught in intermediate states and thus be in an unreliable mode, so that reading these bits returns different results under different read operations. Therefore power losses while programming a certain page can corrupt a paired page.

In the prior arts, error correction codes (ECC) and Redundant Array of Inexpensive Disk (RAID) techniques have been used to mitigate data corruption. In one instance, data corruption is prevented by writing parity pages at a different page address. Those techniques require either additional memory or complicated error-searching and data rebuilding procedures after power returns. Such requirements or solutions make the process costly to implement and place significant strain on the processing power of a conventional flash memory controller, which generally includes only a single processor. Furthermore, if a power failure occurs during the writing of a page, the paired page data can become corrupt in a MLC flash memory device. Therefore even the conventional paired page technique is susceptible to a sudden power interruption. As a matter of fact, the severity of the possible corruption is high; in some cases, every $10^{th}$ data bit can be lost. Relying on conventional ECC techniques to make a MLC flash memory system reliable would be impractical to implement.

NAND flash memory data corruption can also result from program erase cycle wear outs. Electrons are injected and removed by tunneling through thin film oxide insulators. Repeated program/erase cycles damage the oxide and reduce its effectiveness. As device dimensions (e.g., oxide film thickness) shrink, data integrity problems from device wearing out can become more severe. One factor that influences this wearing out process is the speed at which the program and erase cycles are performed. However, if the speed of programming and erasing is slowed to avoid wearing out, overall performance can be impacted significantly.

Currently, a technique exists which applies a lower sense voltage to measure the charge states of the flash memory, in order to extend the lifetime of the memory device. A flash memory device is a charge-trap device that uses sense circuits to detect if a cell contains a given charge level. However, as the device wears out, its ability to store a charge is compromised. A worn out memory device allows the stored charge on the floating gate to leak. Consequently a sense circuit will detect a reduced voltage from the device. One current recovery mechanism reduces the sense voltage that is used to determine the logic value a cell contains. However, a lower sense voltage also returns a lower detected voltage, thus resulting in an incorrect charge tracking.

SUMMARY OF THE INVENTION

The present invention provides a two-dimensional self-RAID method of protecting, following a power loss, page-based storage data in a multiple-level-cell flash memory device. The process includes reserving a parity sector in each data page under an application of RAID ("First dimensional RAID") technique, thereby forming a parity group containing a predetermined number of pages, and repeating the parity grouping for every subsequent data pages under a second application of a RAID technique ("Second dimensional RAID"). Thus if a subsequent write corrupts a paired page, the lost data can be recovered using the two dimensional RAID data.

The first dimensional parity in the present invention is associated with a data page. One sector within the page is reserved for the first dimensional RAID data. This parity sector allows the recovery of any single sector within the ECC capability of that sector. This level of RAID data can be calculated from the available data at the time the controller transfers the data to a chip buffer.

The second dimensional parity in the present invention is calculated across a column of sectors in a predetermined number of pages. When the specific page number is selected carefully, paired page faults can be recovered.

Full data protection against power interruption is achieved because any corrupted data sector can be recovered by the RAID data either from the within page sector parity or from the crossed sector page parity.

The present invention provides a method of preserving page-based flash memory integrity during writing, in the event of a power loss. The present invention can be used to manage a flash memory having multiple level cells (MLC).

According to an embodiment of the present invention, a method is provided to protect a MLC flash memory data which includes numerous memory pages. A method of managing a multiple level cell flash memory that includes a plurality of pages, each page including a plurality of sequentially numbered sectors, the method comprising: (a) choosing a sector in each page as a parity sector; (b) writing data into each page and calculating a parity value of the sectors in each page and storing the parity value in the reserved parity sectors; (c) dividing data pages into a plurality of groups, wherein each group, except the first group and the last group, consists of a first predetermined number of pages; (d) reserving a page in each group as a group parity page and writing data into each page of the group, calculating a parity value of the group and storing the parity value in the reserved group parity page; (e) repeating (a) to (d) for each group; (f) reserving a new page to store a column parity of all sectors sharing the same sector number.

According to another embodiment of the present invention, a method is provided to protect a MLC flash memory data which includes numerous memory pages. A method of managing a multiple level cell flash memory that includes a plurality of pages, each page including a plurality of sequentially numbered sectors, the method comprising: (a) reserving a parity block; (b) choosing a sector in each page as a parity sector; (c) writing data into each page and calculating a parity value of the sectors in each page and storing the parity value in the chosen parity sector; (d) dividing data pages into a plurality of groups, wherein each group, except the last group, consists of a second predetermined number of pages; (e) writing data into pages in a subset of a group and calculating the subset group parity; (f) storing the subset group parity value in the reserved parity block; (g) writing data into the remaining pages of the group; (h) repeating (b) to (g); (i) reserving a new page to store a column parity of sectors sharing the same sector number but residing in different pages.

According to the present invention, a data storage system is provided in which the above methods can be operated upon.

According to the present invention, a method for reducing data corruption from device wearing out is provided by extending the programming and erasing time on selected weak cells. Weak cells are identified by the rate they generate errors, and then the blocks and pages associated with the weak cells can be programmed and erased at a slower rate than other cells. By tracking the weaker blocks and treating them differently than other more robust blocks, endurance can be enhanced. Because the slower programming and erasure processes are only performed on the relatively few weak blocks, overall performance is not significantly compromised. A method of managing a multiple level cell flash memory with numerous pages, the method comprising: (a) programming and erasing data on a page at a predetermined speed; (b) detecting an error rate for each of the pages and identifying the pages associated with error rates that exceed a predetermined value; (c) programming and erasing the identified high error page set a speed that is slower than the predetermined speed.

According to another embodiment of the present invention, a method for overcoming the leakage induced charge level shifts is provided. A method of managing a multiple level cell flash memory that includes a sense circuitry, the method comprising: (a) selecting a sense voltage; (b) detecting charge levels of memory cells in the multiple level cell flash memory with the selected sense voltage, and making a first table that correlates the predetermined sense voltage and the sensed charge levels; (c) reducing the sense voltage and detecting charge levels of memory cells in the multiple level cell flash memory using the reduced sense voltage and making a second table that correlates the reduced sensed voltage with the sensed charge levels; (d) replacing the first table with the second table.

The present invention is better understood upon consideration of the detailed description below in conjunction with the accompanying drawings.

DESCRIPTION OF THE DRAWINGS

FIG. 6 illustrates the concept of column parity without group parity.

FIG. 7 illustrates the concept of sector parity or row parity.

FIG. 8 shows group parity with 8 pages in each parity sector group.

FIG. 10 shows 8-page group parity configuration in accordance with an embodiment of the present invention.

DETAILED DESCRIPTION OF THE PREFERRED EMBODIMENTS

Figure 1:
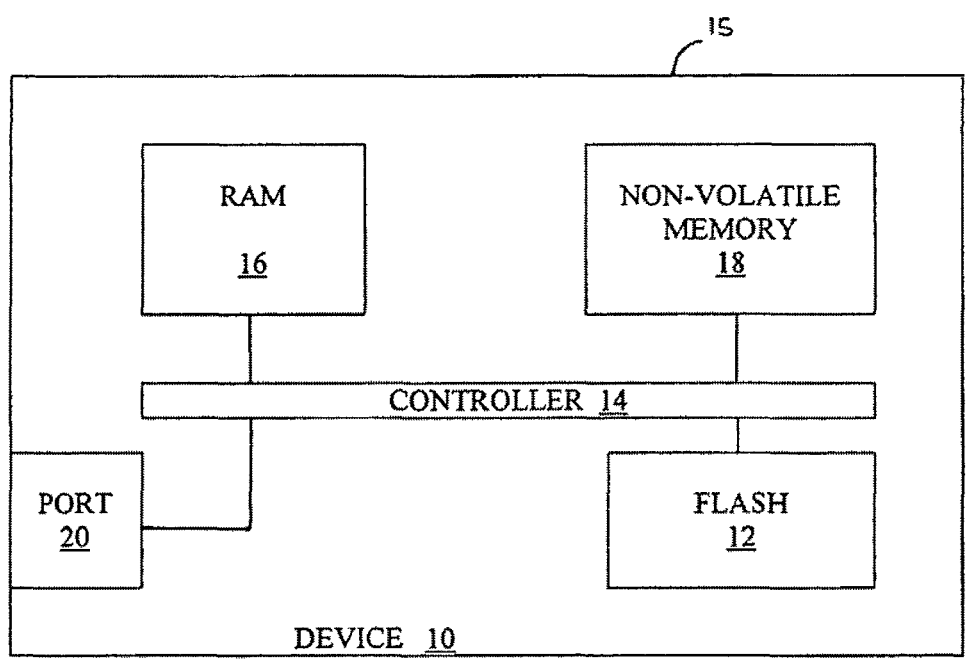
FIG. 1 shows a schematic block diagram of a device controller using a flash medium for non-volatile data storage.

FIG. 1 is a high level schematic block diagram of a conventional NAND flash media device in a non-volatile data storage unit.

Figure 2:
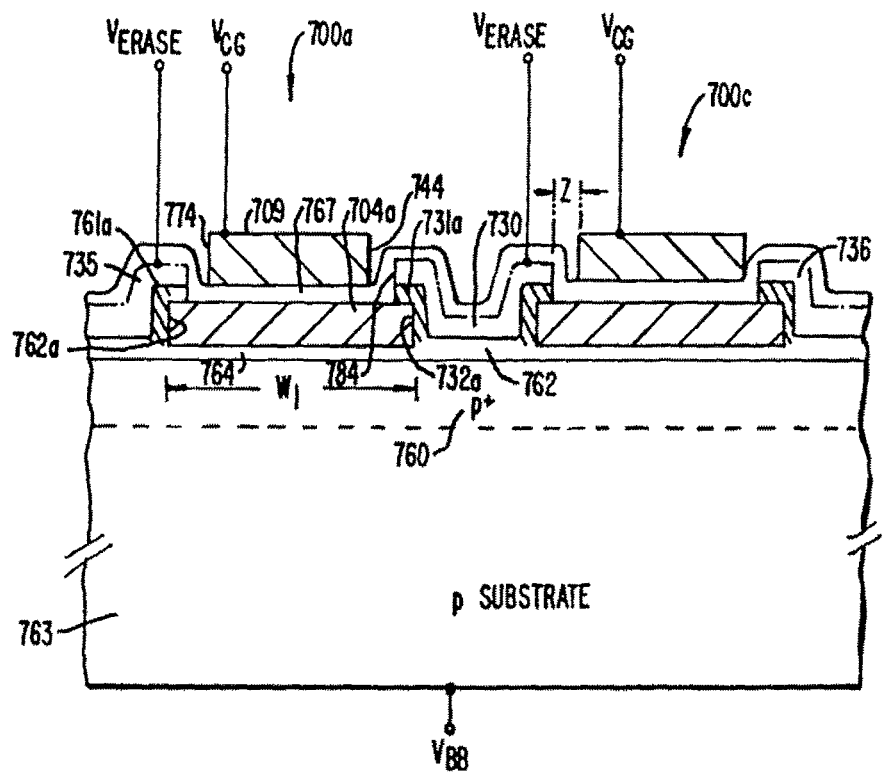
FIG. 2 is a cross sectional view of a flash memory device.

FIG. 2 shows a cross sectional view of a conventional flash memory device.

Figure 3:
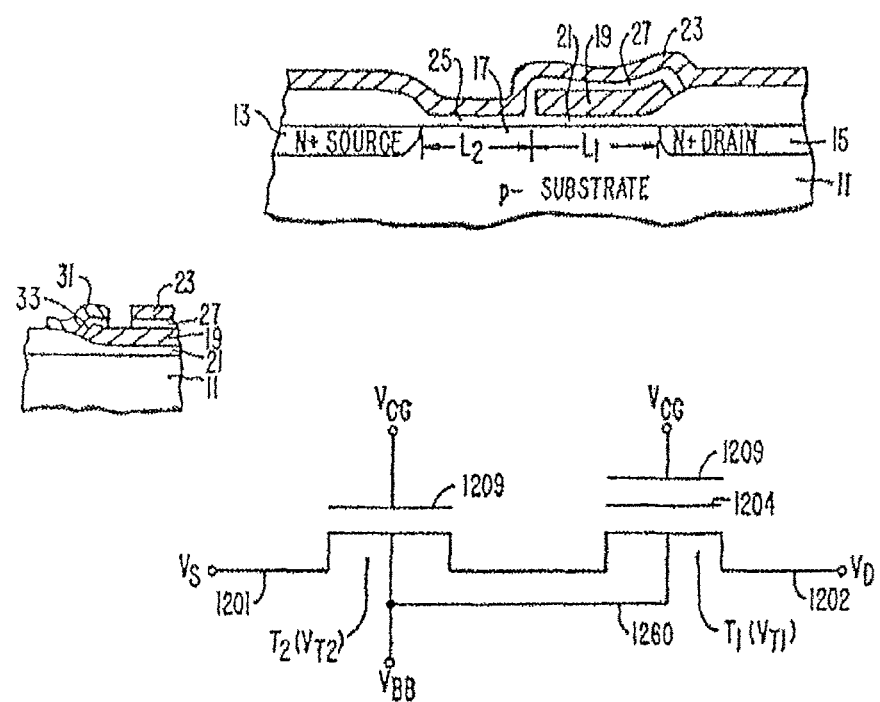
FIG. 3 shows a cross sectional view of a multi-level flash memory cell and its equivalent circuit diagram.

An example of a conventional multiple level (MLC) flash memory cell is illustrated in FIG. 3, where a split channel device has two different threshold voltages, Vt1 and Vt2. The referenced cross sectional view and equivalent circuit are taken from U.S. Pat. No. 5,045,940 (Harari).

Figure 4:
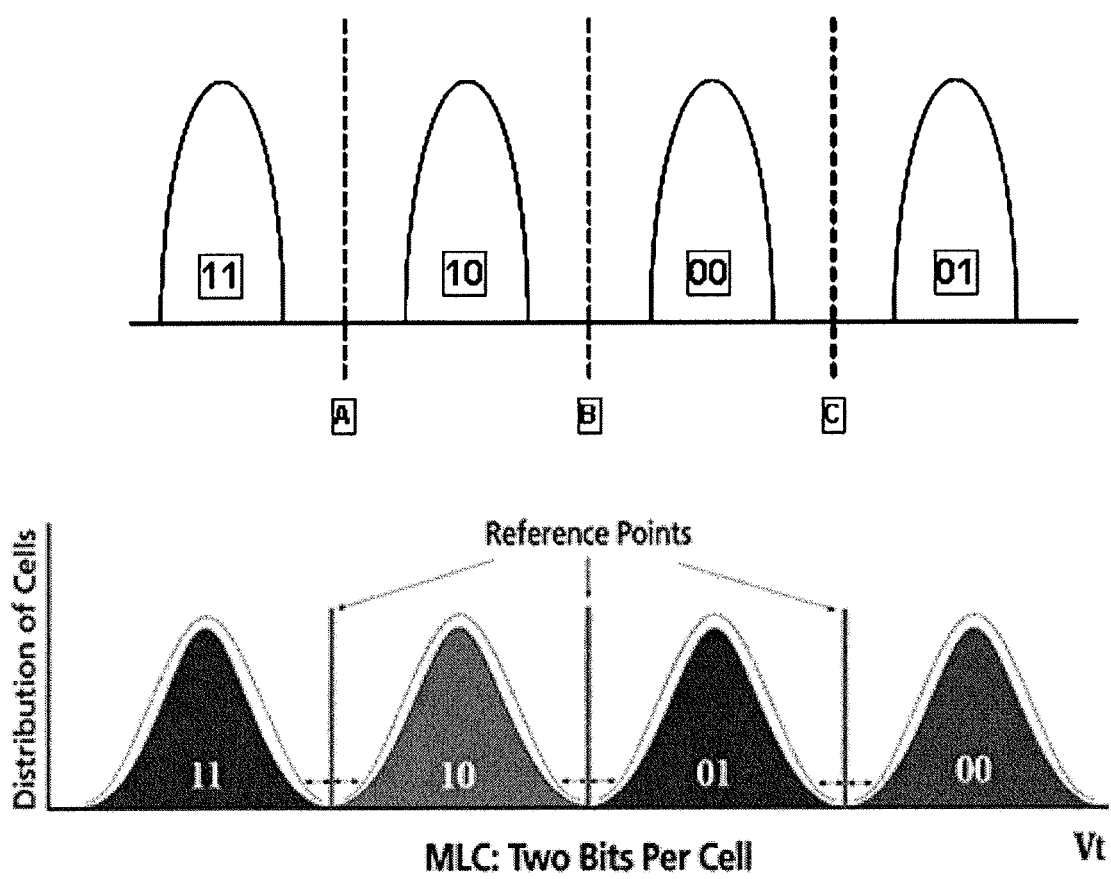
FIG. 4 shows a two bit-MLC threshold voltage ranges in a MLC flash memory device.

Variations of the electronic states generate ranges of threshold voltages in a real MLC system. FIG. 4 depicts the threshold voltage spans in a conventional two-bit MLC device.

Figure 5:
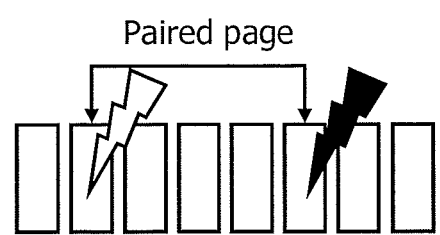
FIG. 5 is a flash memory paired page diagram.

Pages of data sharing the same multiple level cells are called "shared pages". Each manufacturer may use a different distance between its shared pages. Many memory vendors prefer to set the distance at four. For example, at a pair distance of 4, page 0 is paired with page 4, page 1 is paired with page 5, page 2 is paired with page 6, and page 3 is paired with page 7. FIG. 5 shows the paired pages concept at the pair distance of 4.

The paired pages may share the same memory cells in a MLC flash memory system (e.g., in a 2-bit MLC flash memory, bit 0 and bit 1 of a memory cell are bits from the first and second pages of the paired pages, respectively). When a program operation is abnormally aborted, for example, during a power down or a reset, not only is the page data that is being programmed damaged, the data in the paired page may also be damaged, even though it may have been written correctly at a previous time.

According to one embodiment of the present invention, RAID techniques are applied in a method along two dimensions. In the first dimension, "the first dimensional RAID"), the method preserves parity information on the same page. The first dimensional RAID uses row parity or the sector parity, which is calculated using data from the first sector to the last sector in the same page. As shown in FIG. 7, there are 31 sectors of data in each page, respectively labeled Sec 00 to Sec 30. A single sector within each page is reserved for storing the first dimensional RAID data (i.e., the row or sector parity). In FIG. 7, p0 sector is the parity sector for Page 0, and sector pX is the parity sector for Page X. One common error correction code (ECC) allows single-bit error correction. With an extra parity bit, double-bit errors can be detected. Therefore the parity data in the parity sector allows recovery of any sector in a page within the ECC capability of the sector, in the event of a power interruption. Sector parity may be calculated from all the data in the page at the time the data is moved from the controller to a chip buffer.

In the second dimension ("the second dimensional RAID"), the method preserves parity data calculated over a number of pages in a parity group. Such parity data is referred to as group parity. The number of pages in each parity group is variable. In one implementation, for example, the number of pages in a parity group is 8 pages.

Group parity that is calculated for corresponding sectors over all pages in a block is referred to column parity. FIG. 6 illustrates column parity in a 64 page data set. In FIG. 6, each column parity value is calculated over the same sectors, for example, Sec X, from all the pages. The parity value is calculated and written in a parity page designated for the block, with a column parity calculated for the same sector in all the pages of the block.

Group parity in the second dimensional RAID provides additional parity protection in a flash memory device. A group parity for a parity group that includes less than all pages of a block sets a higher level of protection than column parity which is illustrated in FIG. 6. As a first step, the number of pages in the parity group is selected as the group size. This number is chosen carefully in order to provide adequate protection from paired page faults and is often selected by the MLC flash memory manufacturer. For the pairing chosen, a typical group size is 8. FIG. 8 shows group parity with 8 pages in each parity sector group. In FIG. 8, pages p3, p11, p59 are parity pages.

Figure 9:
FIG. 9 is a table that summarizes the 2-dimensional RAID group parity scheme showing a flash memory data set of 63 pages (rows) and 31 sectors (columns).

FIG. 10 illustrates a parity grouping configuration applicable to the configuration shown in FIG. 8, according to one embodiment of the present invention. As shown in FIG. 10, the first group (i.e., Group 1) is a half group. In each subsequent group of 8 pages, the first 4 pages are paired with the 4 pages in the previous group. For instance, if the page pairing sequence at the multiple level cells is 0-4, 1-5, 2-6 and 3-7 (i.e., page 0 is paired to page 4, page 1 is paired to page 5, page 2 is paired to page 6, and page 3 is paired to page 7), then for each write of any of pages 0, 1, 2, a corresponding 2-dimensional RAID group parity write can be performed on group parity page 3. In the event that a subsequent write of a page in any of pages 4 to 6 corrupts the corresponding paired page 0, 1, or 2 the data loss may be recovered using the RAID data from the previously written group parity page 3. Thus the group parity page protects page 0-2 in parity group 1 of 4 pages. The group 2 parity page is page 11, protecting page 8, 9, 10 from damages caused by power interruption during writing pages 12 to 14. FIG. 9 is a table that summarizes the 2-dimensional RAID group parity scheme showing a flash memory data set of 63 pages (rows) and 31 sectors (columns).

As shown in FIG. 9, Page 3, Page 11 . . . and Page 59 are such selected to be the group parity pages for 8-page groups. First half of each group is paired, or co-resided with the second half of the previous group, on the same MLC flash memory device.

Figure 11:
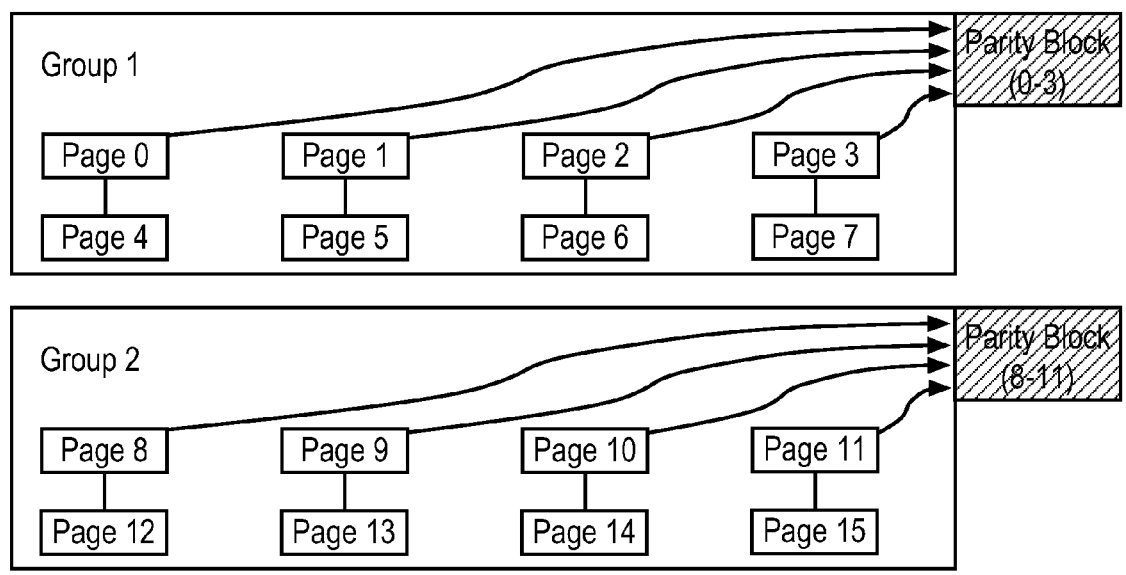
FIG. 11 shows 8-page group parity configuration using a set aside parity block in accordance with another embodiment of the present invention.

FIG. 11 illustrates a parity grouping configuration in anther embodiment of the present invention. In FIG. 11, all groups contain 8 pages. The page pairing sequence at the multiple level cells is 0-4, 1-5, 2-6 and 3-7 (i.e. page 0 is paired to page 4, page 1 is paired to page 5, page 2 is paired to page 6, and page 3 is paired to page 7). The group parity for pages 0-3 is written to a set-aside parity page in parity block outside the data pages. If there is power interruption during a subsequent writing of any of pages 4-7, the parity page in the set-aside parity block may be used to recover the damaged data in pages 0-3. If pages 4-7 are written successfully, the parity page for pages 0-3 in the parity block outside the data pages can be saved for future reference, and also can be erased if desirable. This process is repeated for every 8 pages.

Another advantage of this type of RAID protection is that it does not require reads to generate the parity data on writes. All that is required is a parity cache for the pages being written. This simplifies the algorithm required for parity generation and does not cause a write performance penalty. The only time performance is affected is during the rebuild of data in the event that a hard error is encountered.

Although in the detailed description of the current invention, an exemplary number of 8 are used as the number of pages in a group, the invention does not limit the number of pages in a group to 8.

To implement the scheme shown in FIG. 11, in the first dimension, each of the 64 pages is provided with a parity sector (located, for example, in the second sector of each page). The parity sector in each page provides the first dimensional RAID. In the second dimension, there are two levels of parity protection. First, there is column parity for all pages. In the column parity page, each sector stores the column parity calculated based on all the corresponding sectors of all the pages. Second, group parity is also recorded according for pages grouped according to a selected group size. The group parity may be written to set-aside parity blocks. Alternatively, the group parity may use the $4^{th}$, $11^{th}$, $19^{th}$ . . . $59^{th}$ pages to store group parity pages along with the data pages. In one embodiment using set-aside parity blocks, after the second half group of the paired pages are written without any power interruptions, the set-aside parity block written for the first half of the paired pages may be erased or may be saved for future reference.

Figure 12:
FIG. 12 shows a protection scheme using a two-dimensional RAID technique (example 1).

FIG. 12 illustrates how the two dimensional RAID protection works when a number of uncorrectable sectors occur in one embodiment of the present invention (the corrupted sectors are represented in FIG. 12 by densely lined blocks). For example, Sec 00 in Page 4 and Sec 02 in Page 5 are single errors in the respective pages; therefore, the data loss in the corresponding sector can be recovered from the parity sector on each of those pages respectively. However, as Page 7 is corrupted in two sectors, the corruption in Sec 00 in Page 7 can be recovered from the group parity page 11. Similarly, the corruption in Sec 02 in Page 9 can also be recovered from the group parity page 11. Subsequent to the above corrections, both Sec 30 in Page 7 and Sec 30 in Page 9 can be recovered from the parity sectors p7 and p9 respectively, since the other sectors in those pages have been recovered. Thus it is possible to recover data even though there are two bad sectors in one page or in one column.

Figure 13:
FIG. 13 shows a protection scheme using a two-dimensional RAID technique (example 2).

In a more severe power interruption scenario when a number of paired pages are affected in a single page or in a single column, the group sector parity is able to recover corrupted data by combining the row parity, column parity and group parity. One example of the recovery scheme is illustrated in FIG. 13, where multiple hard errors exist (the error sectors are represented with dense-lined blocks). Sec 00 in Page 0, Sec 02 in Page 1 and Sec 02 in Page 5 are single errors in the corresponding pages; therefore, they can be recovered from the parity sectors in those pages respectively. Sec 29 in Page 9 can be recovered from the group parity in Sec 29 of Page 11. After these corrections are made, Sec 00 in Page 3 can be recovered by recalculating group parity of Sec 00 over pages 0-2, and Sec 02 in Page 9 can be recovered from the group parity of Sec 02 in Page 11. Subsequent to those corrections, Sec 00 in Page 7 is correctable from the group parity page 11, Sec 02 in Page 13, and Sec 29 in Page 13 can be recovered from the group parity page 19. Following the above corrections, Sec 30 in Page 3, Sec 30 in Page 7, Sec 30 in Page 9 and Sec 30 in Page 13 can be recovered from the corresponding parity sectors since the other bad sectors in relevant pages have been recovered. Thus it is possible to recover data even though there are four sectors with hard errors residing in one column.

In one embodiment of the present invention where a set aside parity block outside the data pages is used to reserve the group parity, an algorithm can be written for the process of data writing, when data is protected against the write-corrupt at a power interruption. This algorithm comprises the following steps for a parity group of 8 pages:
  a) Write 4 pages from pages 0 to page 3 and calculate the group parity for pages 0-3;
  b) Write the group parity page to a Parity-Block outside the data memory;
  c) Write pages 4-7;
  d) Release the Parity-Block of pages 0-3, used Parity-Block can be saved or erased;
  e) Repeat the process a) to d) for every subsequent group of 8 pages;
  f) Treat the last group the same way even if the last group has less than 8 pages.

Figure 14:
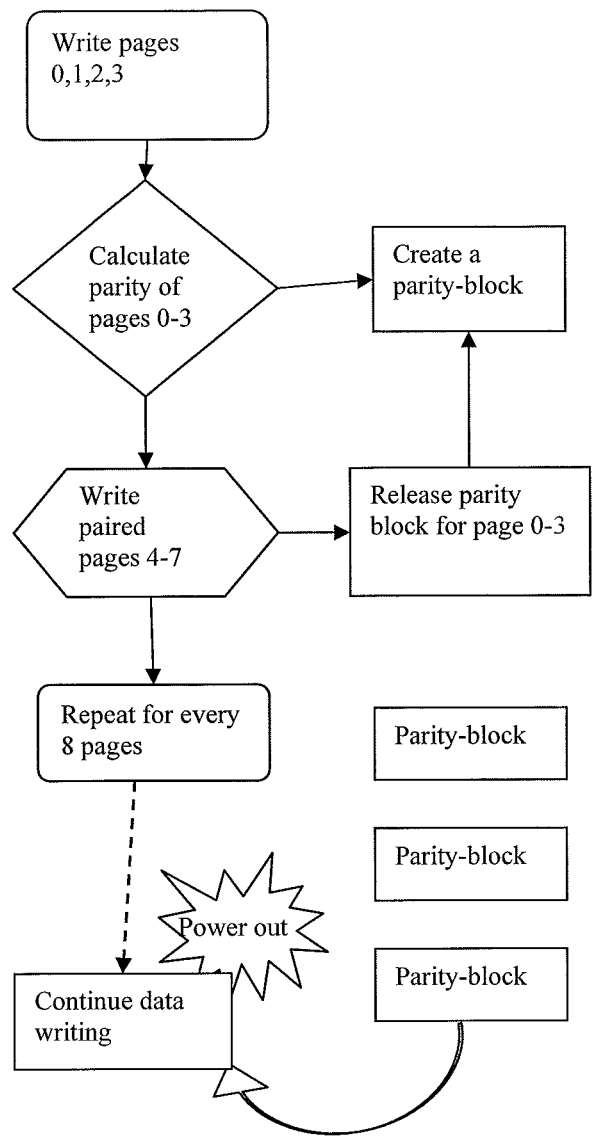
FIG. 14 is a flow chart of an algorithm which protects a MLC flash memory device against corruption resulting from a power interruption during a write operation.

This algorithm is also illustrated in FIG. 14.

The foregoing description is intended to illustrate, but not to limit, the scope of the invention, which is defined by the scope of the appended claims. Other embodiments are within the scope of this disclosure.

What is claimed is:

1. A method of managing a multiple level cell flash memory that is organized logically into one or more blocks each having a plurality of pages, each page including a plurality of sectors, the method comprising:
  identifying a parity block;
  choosing a parity sector in each page of a respective block;
  assigning the pages of the respective block into a plurality of groups;
  for each page of the respective block, calculating a sector parity value for data stored in the sectors in the page and storing the sector parity value in the parity sector of the page;
  prior to completing data writing into all pages of a group in the respective block, calculating a subset group parity for a subset of pages in the group, the subset of pages comprising a plurality of pages in the group in the respective block; and
  storing the subset group parity in the parity block.

2. The method as in claim 1, wherein the group in the respective block comprises a first group, and the subset of pages in the first group is a first subset of pages in the group; and
  the method further comprising:
    repeating said calculating and storing for a second subset of pages in a second group distinct from the first group.

3. The method as in claim 1, wherein the sectors of each page are each assigned a sector number, the method further comprising:
  selecting a column parity page and calculating, for each sector number, a column parity for all sectors assigned the sector number in the pages of the respective block.

4. The method as in claim 1, wherein each group consists of 8 pages.

5. The method as in claim 1, wherein each multiple level cell of a plurality of multiple level cells in the multiple level cell flash memory is shared by two pages of the same group.

6. The method as in claim 1, wherein the parity block resides outside the flash memory.

7. The method as in claim 1, wherein the parity block resides on a non-volatile memory.

8. The method as in claim 1, wherein the subset group parity, for the subset of pages in the respective group, is erased after data is completely written into the pages of the respective group.

9. The method as in claim 1, wherein the subset group parity, for the subset of pages in the respective group, is saved after data is completely written into the pages of the respective group.

10. The method as in claim 1, wherein the subset group parity, for the subset of pages in the respective group, is calculated from data in half of the pages of the respective group.

11. A flash memory data storage system operable in accordance with the method of claim 1.

12. A multiple level cell flash memory data storage device, comprising:
  a flash memory array having a plurality of blocks, each block in the plurality of blocks having a plurality of pages, a respective block including a plurality of groups of pages;
  each page of the respective block having a plurality of sectors, including an assigned parity sector;
  wherein the device is operable, for a respective page,
    to store data in data sectors of the respective page;
    to store, in the assigned parity sector of the respective page, a sector parity value of the data stored in the data sectors of the respective page; and
  wherein the device is operable, for a respective group of pages in the respective block,
    to store data in data pages of the respective group of pages; and
    to store, in a parity block, a subset group parity value calculated for a subset of pages in the respective group prior to completing data writing into all pages of the respective group.

13. The multiple level cell flash memory data storage device of claim 12, wherein the device is operable to calculate and store in the parity block subset group parity values for multiple subsets of pages, each subset of pages in a distinct respective group.

14. The multiple level cell flash memory data storage device of claim 12, wherein the sectors of each page are each assigned a sector number, and the device is operable, for the respective group of pages, to select a column parity page for the respective block and to calculate, for each sector number, a column parity for all sectors assigned the sector number in the pages of the respective block.

15. The multiple level cell flash memory data storage device of claim 12, wherein each group consists of 8 pages.

16. The multiple level cell flash memory data storage device of claim 12, wherein the parity block resides outside the flash memory.

17. The multiple level cell flash memory data storage device of claim 12, wherein the parity block resides on a non-volatile memory.

18. The multiple level cell flash memory data storage device of claim 12, wherein the subset group parity, for the subset of pages in the respective group, is erased after data is completely written into the pages of the respective group.

19. The multiple level cell flash memory data storage device of claim 12, wherein the subset group parity, for the subset of pages in the respective group, is saved after data is completely written into the pages of the respective group.

20. The multiple level cell flash memory data storage device of claim 12, wherein the subset group parity, for the subset of pages in the respective group, is calculated from data in half of the pages of the respective group.

21. The multiple level cell flash memory data storage device of claim 12, wherein each multiple level cell of a plurality of multiple level cells in the multiple level cell flash memory is shared by two pages of the same group.

22. The multiple level cell flash memory data storage device of claim 12, wherein each multiple level cell of a plurality of multiple level cells in the multiple level cell flash memory is shared by two pages assigned to different groups.

23. The multiple level cell flash memory data storage device of claim 22, wherein the groups are each assigned a group number and wherein the pages sharing the respective multiple level cell are assigned consecutive group numbers.

24. The multiple level cell flash memory data storage device of claim 23, wherein one or more of the groups are assigned half the number of pages as assigned to each of the remainder of the groups of the respective block.

25. A method of managing a multiple level cell flash memory that is organized logically into one or more blocks each having a plurality of pages, each page including a plurality of sectors, the method comprising:
   choosing a parity sector in each page of a respective block;
   assigning the pages of the respective block into a plurality of groups, each group in the respective block including an assigned parity page;
   for each page of the respective block, calculating a sector parity value for data stored in the sectors in the page and storing the sector parity value in the parity sector of the page;
   calculating a group parity value for data stored in the pages of the group; and
   storing the group parity value in the assigned parity page.

26. A multiple level cell flash memory data storage device, comprising:
   a flash memory array having a plurality of blocks, each block in the plurality of blocks having a plurality of pages, a respective block including a plurality of groups of pages, each group of pages in the respective block including an assigned parity page;
   each page of the respective block having a plurality of sectors, including an assigned parity sector;
   wherein the device is operable, for a respective page,
      to store data in data sectors of the respective page;
      to store, in the assigned parity sector of the respective page, a sector parity value of the data stored in the data sectors of the respective page; and
   wherein the device is operable, for a respective group of pages in the respective block,
      to store data in data pages of the respective group of pages; and
      to store, in the parity page of the respective group, a group parity value of the data stored in the data pages of the respective group.

* * * * *